(12) United States Patent
Goh

(10) Patent No.: US 7,489,167 B2
(45) Date of Patent: Feb. 10, 2009

(54) VOLTAGE DETECTION AND SEQUENCING CIRCUIT

(75) Inventor: Ban Hok Goh, Reservoir View (SG)

(73) Assignee: Infineon Technologies AG, Munich (DE)

( * ) Notice: Subject to any disclaimer, the term of this patent is extended or adjusted under 35 U.S.C. 154(b) by 455 days.

(21) Appl. No.: 11/411,335

(22) Filed: Apr. 26, 2006

(65) Prior Publication Data

US 2007/0257727 A1    Nov. 8, 2007

(51) Int. Cl.
*H03L 7/00* (2006.01)

(52) U.S. Cl. .............. 327/143; 327/81; 327/82; 307/43; 307/81

(58) Field of Classification Search .......... 327/80–82, 327/143; 307/80–81
See application file for complete search history.

(56) References Cited

U.S. PATENT DOCUMENTS

| | | | | |
|---|---|---|---|---|
| 5,552,643 A * | 9/1996 | Morgan et al. | ............ | 307/81 |
| 6,333,650 B1 * | 12/2001 | Amin et al. | ............ | 327/143 |
| 6,429,706 B1 * | 8/2002 | Amin et al. | ............ | 327/143 |

\* cited by examiner

*Primary Examiner*—Long Nguyen
(74) *Attorney, Agent, or Firm*—Brinks Hofer Gilson & Lione

(57) ABSTRACT

A voltage detection and sequencing circuit is provided, preferably on a single semiconductor chip, for applying a plurality of voltages to an electrical system in a predetermined sequence. The circuit includes a plurality of subsystems each adapted to detect one of a plurality of supply voltages at an input terminal and to supply the supply voltage to at least one output terminal in a predetermined sequence as controlled by a sequencing means.

25 Claims, 4 Drawing Sheets

VOLTAGE DETECTION AND SEQUENCING CIRCUIT

BACKGROUND

1. Field of the Invention

The invention relates to a voltage detection and sequencing circuit.

2. Description—Related Art

Many electrical systems require power to be applied to subsystems and components in a predetermined time sequence during system power up. This is particularly the case with computer systems where supply voltages must be applied to different subsystems in a predetermined order when the computer is turned on. For example, complex system on chip (SOC) systems such as the Ethernet switch SOC require at least two power supplies to power up the chip. Some SOC chips even require three or four power supplies to power the chip. In the Ethernet switch SOC, two different types of power supply are required, namely an Input/Output (IO) power supply of 3.3V and a core voltage supply of 1.8V. The IO power supply provides the necessary power for interface with other chips while the core voltage is used to power the chip's core. If the power is not supplied to the chip in the correct sequence, namely the core voltage supply must be supplied before the IO supply voltage, then the chip will not operate and the user of a system incorporating such a chip will encounter problems. The problems become worse when more than two power supplies have to be sequenced.

Voltage sequencing circuits have, therefore, been developed to sequence the application of voltages in such systems and to control the delay period between the application of two successive voltages. An example of a prior art voltage sequencing circuit is shown in FIG. 3, which illustrates such a circuit for sequencing the power supply to an SOC such as the aforesaid Ethernet switch SOC. Here, the chip 10 is located within an external power sequencing circuit and has a number of pins 1 to 8 to provide communication between the power sequencing circuit and the rest of the electrical system. A core voltage of 1.8 V is supplied to the chip 10 via voltage terminals 11, 12, and resistors 14 and 15 are arranged with a trip point of 1.65 V. An IO power supply of 3.3V is supplied to the chip 10 via voltage terminals 16, 17 and a pass device 18, such as an insulated gate field effect transistor (IGFET) that has source-drain terminals connected to the voltage terminals 16, 17 and a gate terminal connected to the chip 10. The chip 10 monitors the core voltage 11, 12 and will only turn on the pass device 18 when the core voltage supply reaches a threshold of 1.65V. When the pass device is turned on, the IO supply voltage of 3.3V is then supplied to the chip 10. Hence, the voltage sequencing circuit ensures that the IO supply voltage is supplied later than the 1.8 core voltage.

It will be appreciated, however, that this arrangement has several disadvantages. The primary disadvantage is that it introduces complexity into the electrical system because of the external circuit components. This complexity is significantly increased in cases where a third power supply needs to be sequenced. Also, the cost of the system is increased as a direct result of the complexity as additional components must be added and space is required to accommodate them. This also adds to the design costs. Accordingly, there is a need for simplified and cost effective voltage detection and sequencing circuit.

SUMMARY

According to one embodiment of the present invention there is provided a voltage detection and sequencing circuit for applying a plurality of voltages to an electrical system in a predetermined sequence, having a plurality of subsystems each adapted to detect one of said plurality of supply voltages at an input terminal and to supply said one supply voltage to at least one output terminal in a predetermined sequence as controlled by a sequencing means. Each subsystem produces a control signal when said one supply voltage supplied to its input terminal is above a predetermined threshold and each subsystem comprises at least one pass device that under control of at least one of said control signal and said sequencing means couples said input terminal to said at least one output terminal; and said sequencing means comprises at least one logic gate located within at least each of said subsystems other than that subsystem required to output its supply voltage first in said predetermined sequence. The logic gate is adapted to receive as input signals said control signals from as many of said subsystems as necessary to produce an output signal to enable said at least one pass device of said subsystem in which said logic gate is located to be turned on in said predetermined sequence.

Preferably, the subsystems of the invention are implemented on a single semiconductor chip and one of the supply voltages supplied to one of the subsystems is used to power all of the other subsystems. Additionally or alternatively, each of the subsystems of the pass device couples the input terminal to said at least one output terminal a predetermined length of time after production of said control signal. The predetermined length of time is preferably controlled by a programmable delay circuit.

In another embodiment, each subsystem comprises a comparator to generate the control signal. In each subsystem the supply voltage is applied to one input terminal of the comparator and a predetermined reference voltage is applied to a second input terminal of the comparator, preferably via a hysteresis control loop.

Additionally, the sequencing means comprises at least one AND gate located within at least each of said subsystems other than that subsystem required to output its supply voltage first in the predetermined sequence. Each AND gate is adapted to receive as input signals the control signals from the subsystem in which it is located and from those other subsystems required by said predetermined sequence to operate before the subsystem in which it is located and to produce an output signal to enable the pass device or devices of the subsystem in which the AND gate is located to be turned on.

According to another embodiment of the invention, there is provided a method for applying a plurality of supply voltages to an electrical system in a predetermined sequence. The method includes the steps of providing a plurality of subsystems each respectively adapted to detect one of said plurality of supply voltages at an input terminal and to supply said one supply voltage to at least one output terminal in said predetermined sequence as controlled by a sequencing means; producing a control signal in each subsystem when said one supply voltage supplied to its input terminal is above a predetermined threshold; providing at least one pass device that under control of at least one of said control signal and said sequencing means couples said input terminal to said at least one output terminal; providing a sequencing means comprising at least one logic gate located within at least each of said subsystems other than that subsystem required to output its supply voltage first in said predetermined sequence; inputting as input signals to said logic gate said control signals from as many of said subsystems as necessary to produce an output signal to enable said at least one pass device of said subsystem in which said logic gate is located to be turned on in said predetermined sequence; and supplying said supply voltage supplied to one of said subsystems to power all of said subsystems.

Hence, the invention provides a voltage detection and sequencing circuit and a method of implementing same in a single semiconductor chip structure that uses only one pad per voltage for monitoring to enable an intelligent sequencing of the power supply voltages to an electrical system. A user is also able to set reference voltage thresholds and to program appropriate delays.

Further objects, features and advantages of this invention will become readily apparent to persons skilled in the art after a review of the following description, with reference to the drawings and claims that are appended to and form a part of this specification.

BRIEF DESCRIPTION OF THE DRAWINGS

FIG. 1 is a schematic diagram illustrating as a whole an embodiment of voltage detection and sequencing circuit in accordance with the invention and comprising FIGS. 1a, 1b and 1c, FIGS. 1b and 1c being subsystems embedded within the circuit shown in FIG. 1a;

DETAILED DESCRIPTION

Figure 1A:
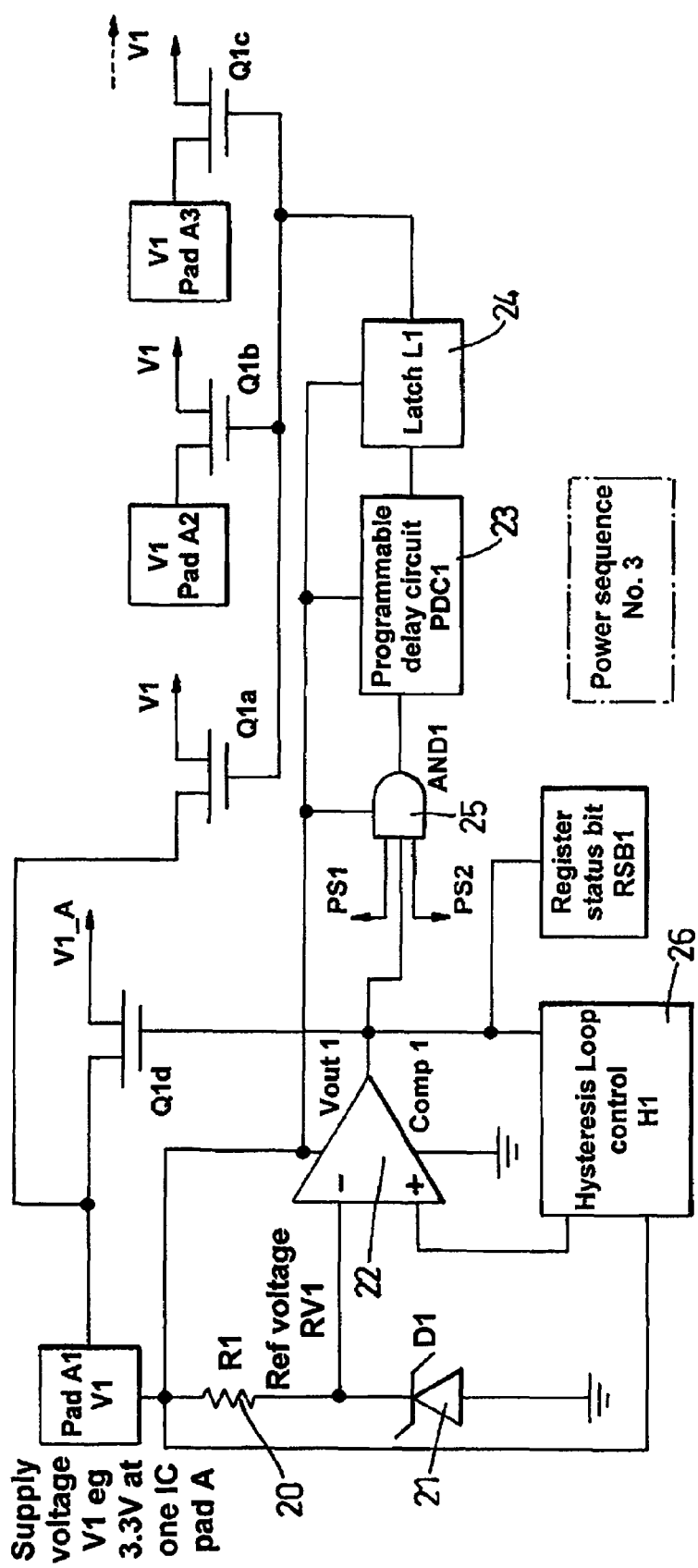
Figure 1B:
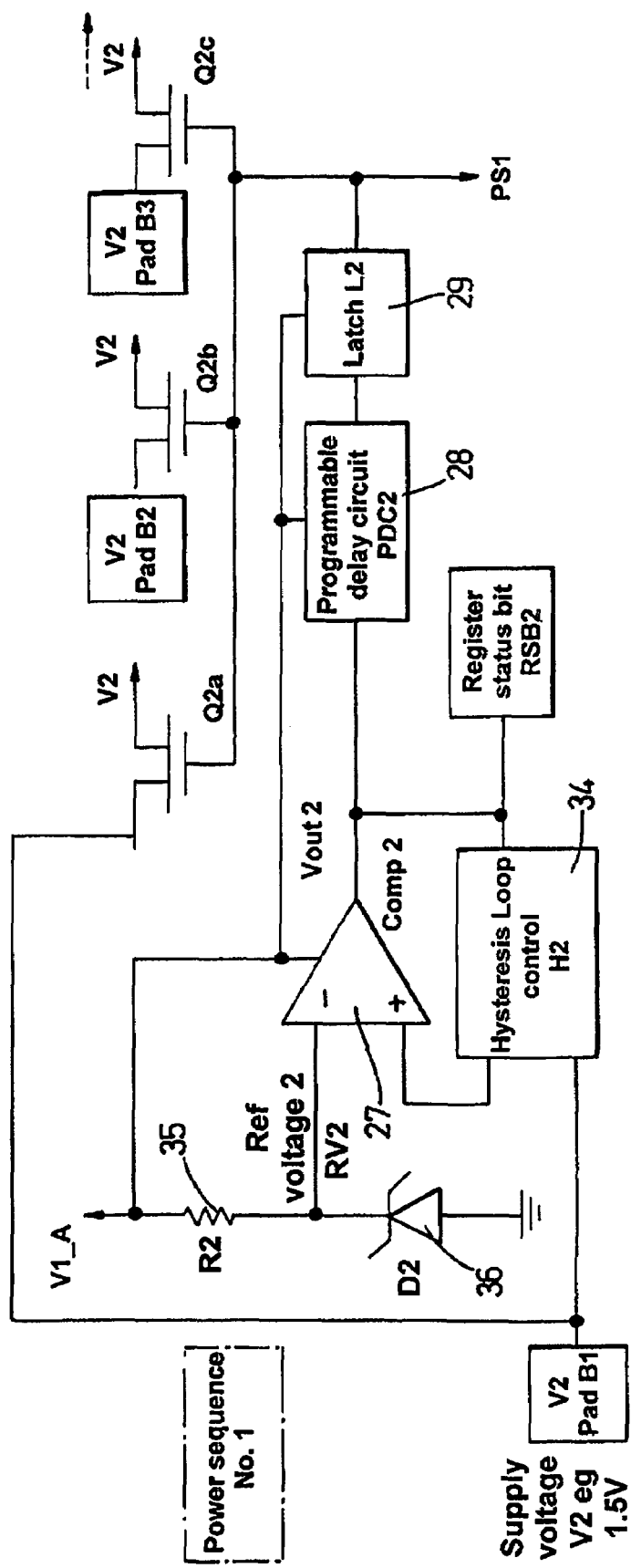
Figure 1C:
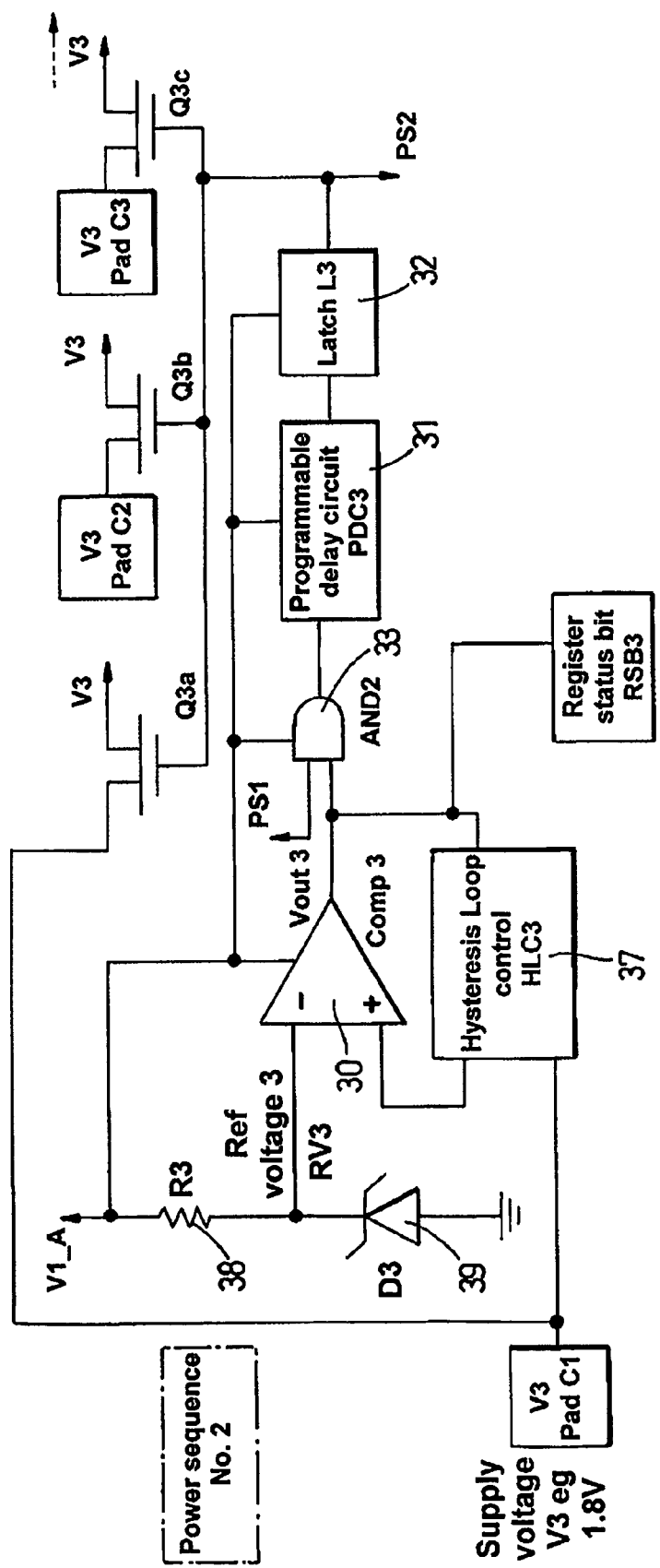

FIGS. 1a, 1b and 1c illustrate one embodiment of a voltage detection and sequencing circuit that is implemented on a single semiconductor chip. The circuit is capable of applying voltages in a predetermined sequential manner to an electrical system such as an integrated circuit package incorporating other chips. This embodiment is capable of applying three voltages, V1, V2, V3 in a sequence. It should be appreciated, however, that any number of voltages can be applied in a predetermined sequence using the same inventive principles. In such cases, the circuit could be increased or decreased to cater for different number of supply voltages.

The power sequence of the supply voltages for this illustrated embodiment is V2 followed by V3 and then V1. Typically, V1 is a 3.3V IO voltage, V2 is a 1.5V core voltage and V3 is a 1.8V second core voltage. When the system is powered up, these power supply voltages V1, V2, V3 are applied to the circuit via power supply detection pads or pins A1, B1 and C1. The circuit detects and sequences these voltages for supply to other external systems or components. V1 is supplied by the circuit shown in FIG. 1a to pads A2, A3 and others as required but only when the required conditions for the supply of V2 and V3 have been met. V2 is supplied by the subsystem shown in FIG. 1b, which is embedded in the circuit shown in FIG. 1a, to pads B2, B3 and others as required. V3 is supplied by the subsystem shown in FIG. 1c, which is also embedded in the circuit shown in FIG. 1a, to pads C2, C3 and others as required but only when the required conditions for the supply of V2 has been met. The pads A1, A2, A3; B1, B2, B3 and C1, C2, C3 are therefore the means of providing communication between the circuit on the chip and an exterior environment, the pads A1, B1 and C1 also being used for power detection purposes.

Referring firstly to FIG. 1a, the circuit arrangement shown here has two distinct functions. The first function is the detection of voltage V1 and the second is the sequencing of the supply of V1 out of the chip from the pads A1, A2, A3. V1 could be any of the voltages supplied to the chip. The circuit arrangement includes the pad A1 supplying via a first output the voltage V1 to a voltage regulating arrangement comprising a resistor 20 and Zener diode 21, a first comparator 22 (COMP1), a programmable delay circuit 23 (PDC1), a latch 24 (L1), and an AND gate 25 (AND 1). Pad A1 also has a second output under the control of pass devices in the form of field effect transistors Q1a, Q1b, Q1c, Q1d to supply V1 to the subsystems shown in FIGS. 1b and 1c and to the pads A2 and A3. The supply voltage to the subsystems is labelled as V1A and is controlled by the field effect transistor Q1d.

Figure 2:
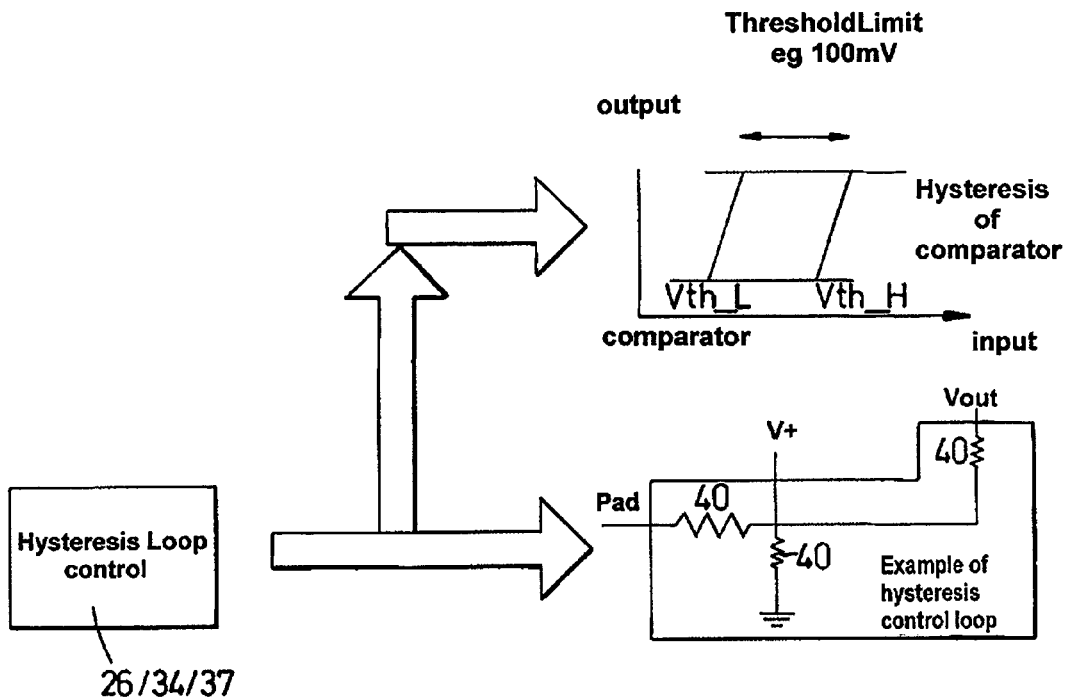
FIG. 2 is a schematic diagram illustrating a hysteresis loop control arrangement for use in each of the subsystems shown in FIGS. 1a. 1b and 1c.
Figure 3:
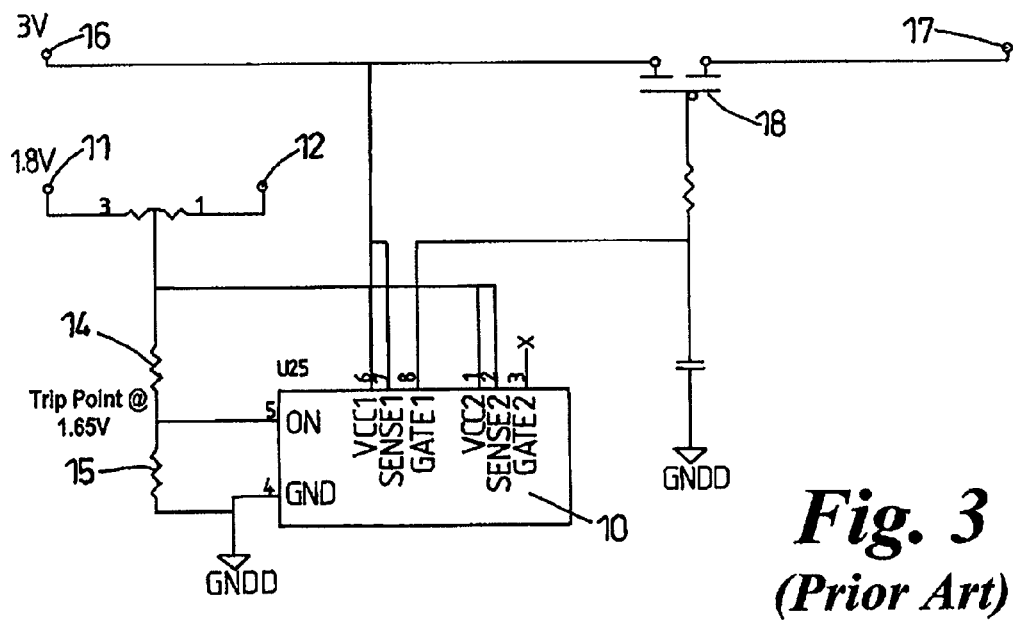
FIG. 3 is a schematic diagram illustrating a voltage sequencing circuit known in the prior art for sequencing two voltage supplies.

First, voltage V1 is applied to pad A1 which in turn applies the voltage via a regulating arrangement as reference voltage RV1 to an inverting terminal of the comparator 22. The reference voltage RV1 will ramp up slowly through the resistor 20 as V1 rises to a predetermined reference level set by the Zener diode 21, for example up to a level of 3V. V1 is also applied to the non-inverting terminal of the comparator 22 as the output V+ of a first hysteresis control loop 26 (H1), as is shown in FIG. 2 and further described below. The comparator 22 will become operational to output a control signal when V1 rises above the minimum voltage threshold requirement. V1 is also supplied to power up the programmable delay circuit 23, the latch 24 and the AND gate 25 (AND1), which controls the supply of power to the pads A2 and A3 via the a programmable delay circuit 23 and the latch 24. However, the AND gate 25 is unable to supply an output signal to the pads A2 and A3 on receipt of the control signal from the comparator 22 until its other two inputs PS1 and PS2 are also turned on. These inputs PS1 and PS2 are supplied via the subsystems shown in FIGS. 1b and 1c respectively. As these subsystems are controlled by the voltages V2 and V3, PS1 can only become high when V2 has been turned on and PS2 can only become high when V3 is turned on. Hence only when V2 and V3 have both been turned on can the AND gate 25 output an enabling signal to operate the programmable delay circuit 23 and the latch 24 which in turn switches on the field effect transistors Q1a, Q1b and Q1c to allow V1 to be supplied out of the chip through all of the pads A1, A2 and A3 respectively. V1 is therefore the last supply voltage to be turned on.

The output voltage Vout1 from the comparator 22 will become high as V+ rises until it crosses the RV1 threshold. When Vout1 is high it will turn on the field effect transistor Q1d to allow the pad A1 to supply the voltage V1A to the subsystems shown in FIGS. 1b and 1c. Specifically, V1A is supplied to power up a second comparator 27 (COMP2), a second programmable delay circuit 28 (PDC2), and a second latch 29 (L2) of the subsystem shown in FIG. 1b and to power up a third comparator 30 (COMP2), a third programmable delay circuit 31 (PDC3), a latch 32 (L3), and a second AND gate 33 (AND 2) of the subsystem shown in FIG. 1c.

With reference to FIG. 1b, this subsystem includes the pad B1 that supplies the second supply voltage V2 under the control of pass devices in the form of field effect transistors Q2a, Q2b, Q2c out of the chip via pads B1, B2 and B3 respectively. Pad B1 also supplies the voltage V2 to the non-inverting terminal of the second comparator 27 via a second hysteresis control loop 34 (H2). The subsystem also comprises a second voltage regulating arrangement comprising a resistor 35 and Zener diode 36 through which the supply voltage V1A is applied to the inverting terminal of the second comparator 27 as reference voltage RV2. The reference voltage RV2 ramps up slowly through the resistor 35 as V1A rises to a predetermined reference level set by the Zener diode 36, for example up to a level of 1.425V. The second comparator 27 will become operational, outputting a high Vout2, control signal when V2 rises above the RV2 threshold.

When the Vout2 control signal is high, it drives the second programmable delay circuit 28 and the second latch 29. After a programmable delay set up by the circuit 28, the latch 29 will turn on the field effect transistors Q2a, Q2b and Q2c to permit the supply voltage V2 to be supplied from the chip through the pads B1, B2 and B3 respectively. The latch 30 also generates the control signal PS1 which is supplied as one of the inputs of the first AND gate 25 and of the second AND gate 33. Hence, only when the power supply V2 has been powered up can the power supplies V1 and V3 also be supplied from the chip.

With reference to FIG. 1c, this subsystem is also powered by the supply voltage V1A, which is used to power the third comparator 30 for detecting the V3 supply voltage. The arrangement includes, in a similar fashion to the other subsystems, a pad C1 that supplies the third supply voltage V3 under the control of pass devices in the form of field effect transistors Q3a, Q3b, Q3c out of the chip via pads C1, C2 and C3 respectively. Pad C1 also supplies the voltage V3 to the non-inverting terminal of the third comparator 30 via a third hysteresis control loop 37 (H3). The subsystem also comprises a third voltage regulating arrangement comprising a resistor 38 and Zener diode 39 through which the supply voltage V1A is applied to the inverting terminal of the third comparator 30 as reference voltage RV3. As with the other subsystems, the reference voltage RV3 ramps up slowly through the resistor 38 as V1A rises to a predetermined reference level set by the Zener diode 39, for example up to a level of 1.71V. The third comparator 30 will then become operational, outputting a high Vout3 control signal when V3 rises above the RV3 threshold.

The Vout3 control signal forms one of the two inputs of the second AND gate 33, the other input being the PS1 signal output by the subsystem shown in FIG. 1b. Hence, only when V2 is already turned on can the second AND gate 33 operate to produce an enabling output signal to drive the third programmable delay circuit 31 and the third latch 32. After a programmable delay set up by the circuit 31, the latch 32 will turn on the field effect transistors Q3a, Q3b and Q3c to permit the supply voltage V3 to be supplied from the chip through the pads C1, C2 and C3 respectively. The latch 32 will also generates the control signal PS2 which, as described above, is supplied as one of the inputs of the first AND gate 25. Hence, only when the power supply V3 has been powered up can the power supply V1 also be supplied from the chip.

The circuit shown in FIG. 1a and each of the subsystems shown in FIGS. 1b and 1c can also be provided with registers RSB1, RSB2 and RSB3 respectively which are linked to the outputs from the hysteresis control loops 26, 34 and 37 respectively. These registers RSB1, RSB2, RSB3 can be used to store a status bit of the power supply registers.

As shown in FIG. 2, the hysteresis control loops 26, 34 and 37 themselves are all similar and comprise simple passive filters with three resistors 40 in a T-formation that prevent false triggering of each of the comparators 22, 27 and 30 respectively by noise. However, by a suitable choice of the resistors 40 each of the loops 26, 34 and 37 can be set up with a different hysteresis threshold with respect to the supply voltages V1, V2 and V3.

Hence, it will be appreciated that the present invention overcomes various problems encountered in the prior art by monitoring the various IO supply voltages and core voltages of the system. The power detection circuit is embedded in a single semiconductor chip structure and uses only one pad per voltage for monitoring to enable an intelligent sequencing of the power supply voltages so that a whole operation is not started until a desired power sequence is achieved. It also enables the user to set reference voltage thresholds and to program appropriate delays. The embedding of the power sequencing circuit in a single chip considerably simplifies the system design complexity thus facilitating PCB layout and debugging, and also reducing cost. In addition, electromagnetic interference problems are reduced as the circuit is less complex than those of the prior art, which will enhance the performance of the chip.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

The invention claimed is:

1. A voltage detection and sequencing circuit for applying a plurality of voltages to an electrical system in a predetermined sequence, comprising:
   a plurality of subsystems each adapted to detect one of said plurality of supply voltages at an input terminal and to supply said one supply voltage to at least one output terminal in a predetermined sequence as controlled by a sequencing means;
   wherein each subsystem produces a control signal when said one supply voltage supplied to the input terminal is above a predetermined threshold and each subsystem comprises at least one pass device that under control of at least one of said control signal and said sequencing means couples said input terminal to said at least one output terminal; and
   said sequencing means comprises at least one logic gate located within at least each of said subsystems other than the subsystem required to provide the one supply voltage first in said predetermined sequence, said logic gate adapted to receive as input signals a plurality of said control signals to produce an output signal to enable said at least one pass device of said subsystem in which said logic gate is located to be turned on in said predetermined sequence.

2. The circuit as claimed in claim 1, wherein said subsystems are implemented on a single semiconductor chip.

3. The circuit as claimed in claim 1, wherein said one supply voltage supplied to at least one of said subsystems is used to provide power all of said subsystems.

4. The circuit as claimed in clam 1, wherein within each of said subsystems said said at least one pass device couples said input terminal to said at least one output terminal a predetermined length of time after production of said control signal.

5. The circuit as claimed in claim 4, wherein said predetermined length of time is controlled by a programmable delay circuit.

6. The circuit as claimed in claim 1, wherein each subsystem comprises a comparator to generate said control signal.

7. The circuit as claimed in claim 6, wherein within each subsystem said one supply voltage is applied to one input terminal of said comparator and a predetermined reference voltage is applied to a second input terminal of said comparator.

8. The circuit as claimed in claim 7, wherein within each subsystem said one supply voltage is applied to said one input terminal of said comparator via a hysteresis control loop.

9. The circuit as claimed in claim 8, wherein the hysteresis control loop of each subsystem has its own hysteresis threshold.

10. The circuit as claimed in claim 8, wherein said hysteresis control loop comprises a passive filter.

11. The circuit as claimed claim 1, wherein said at least one logic gate is an AND gate.

12. The circuit as claimed in claim 1, wherein said at least one pass device includes a field effect transistor (FET).

13. A voltage detection and sequencing circuit for applying a plurality of voltages to an electrical system in a predetermined sequence, comprising:
 a plurality of subsystems each adapted to detect one of said plurality of supply voltages at an input terminal and to supply said one supply voltage to at least one output terminal in a predetermined sequence as controlled by a sequencing means;
 wherein each subsystem produces a control signal when said one supply voltage supplied to said input terminal is above a predetermined threshold and each subsystem comprises at least one pass device under control of at least one of said control signal and said sequencing means to couple said input terminal to said at least one output terminal;
 wherein said sequencing means comprises at least one logic gate located within at least one of said subsystems and adapted to receive as input signals a plurality of said control signals and to output an enable signal to turn on said at least one pass device of said subsystem in which said logic gate is located in said predetermined sequence; and
 wherein said one supply voltage supplied to at least one of said subsystems is used to power all of said subsystems.

14. The circuit as claimed in claim 13, wherein said one subsystem used to power all of said subsystems comprises a subsystem powering pass device which under control of said control signal of said one subsystem couples said input terminal of said one subsystem to each of said other subsystems.

15. A voltage detection and sequencing circuit for applying a plurality of voltages to an electrical system in a predetermined sequence, comprising:
 a first subsystem adapted to detect a first of said supply voltages at a first input terminal and to supply said first supply voltage to at least one first output terminal, and additional subsystems powered by said first supply voltage, each of said additional subsystems being adapted to detect another of said plurality of supply voltages at an additional input terminal and to supply said another supply voltage to at least one additional output terminal in a predetermined sequence with reference both to each other supply voltage and to said first supply voltage as controlled by a sequencing means;
 wherein said first subsystem comprises a first comparator that produces a first control signal when said first supply voltage is above a first predetermined voltage threshold, at least one voltage supply pass device that is enabled by at least one of said first control signal and said sequencing means to couple said first input terminal to said at least one first output terminal, and a circuit powering pass device that is enabled by said first control signal to couple said first input terminal to each of said additional subsystems;
 wherein each of said additional subsystems comprises an additional comparator that produces an additional control signal when said another supply voltage supplied to said additional input terminal is above another predetermined voltage threshold, and at least one additional voltage supply pass device that is enabled by at least one of said additional control signal and said sequencing means to couple said additional input terminal to said at least one additional output terminal; and
 wherein said sequencing means comprises at least one logic gate adapted to receive as input signals said first control signal and said additional control signals and to output enable signals to control operation of said first and said additional voltage supply pass devices in said predetermined sequence.

16. The circuit as claimed in claim 15, wherein within each subsystem said corresponding supply voltage is applied to one input terminal of the comparator of said subsystem and a predetermined reference voltage is applied to a second input terminal of the comparator of said subsystem.

17. The circuit as claimed in claim 16, wherein said predetermined reference voltage is produced by a voltage regulating arrangement using said corresponding supply voltage supplied to said subsystem to power said subsystem.

18. A voltage detection and sequencing circuit for applying a plurality of voltages to an electrical system in a predetermined sequence, comprising:
 a plurality of subsystems that are implemented on a single semiconductor chip and that are each respectively adapted to detect one of said plurality of supply voltages at an input terminal and to supply said one supply voltage to at least one output terminal in a predetermined sequence as controlled by a sequencing means;
 wherein each subsystem produces a control signal when said one supply voltage supplied to said input terminal is above a predetermined threshold and each subsystem comprises at least one pass device that under control of at least one of said control signal and said sequencing means couples said input terminal to said at least one output terminal; and
 said sequencing means comprises at least one AND gate located within at least each of said subsystems other than the subsystem required to output said one supply voltage first in said predetermined sequence, each AND gate adapted to receive as input signals said control signals from the subsystem in which it is located and from those other subsystems required by said predetermined sequence to operate before the subsystem in which it is located and to produce an output signal to enable said at least one pass device of said subsystem in which said AND gate is located to be turned on.

19. A method for applying a plurality of supply voltages to an electrical system in a predetermined sequence, comprising:
 providing a plurality of subsystems each respectively adapted to detect one of said plurality of supply voltages at an input terminal and to supply said one supply voltage to at least one output terminal in said predetermined sequence as controlled by a sequencing means;
 producing a control signal in each subsystem when said one supply voltage supplied to its input terminal is above a predetermined threshold;

providing at least one pass device that under control of at least one of said control signal and said sequencing means couples said input terminal to said at least one output terminal;

providing a sequencing means comprising at least one logic gate located within at least each of said subsystems other than that subsystem required to output its supply voltage first in said predetermined sequence;

inputting as input signals to said logic gate a plurality of said control signals to produce an output signal to enable said at least one pass device of said subsystem in which said logic gate is located to be turned on in said predetermined sequence; and supplying said one supply voltage supplied to one of said subsystems to power all of said subsystems.

20. The method as claimed in clam 19, wherein within each of said subsystems said pass device couples said input terminal to said at least one output terminal a predetermined length of time after production of said control signal.

21. The method as claimed in claim 19, wherein a comparator is provided in each subsystem to generate said control signal.

22. The method as claimed in claim 21, wherein within each subsystem said one supply voltage is applied to one input terminal of said comparator and a predetermined reference voltage is applied to a second input terminal of said comparator.

23. The method as claimed in claim 22, wherein within each subsystem said reference voltage is produced by a voltage regulating arrangement using said one supply voltage supplied to said subsystem to power said subsystem.

24. The method as claimed in claim 19, wherein each logic gate comprises an AND gate receiving as input signals said control signal from the subsystem is located and from those other subsystems required by said predetermined sequence to operate before the subsystem is located and producing an output signal enabling said at least one pass device of said subsystem in which said AND gate is located to turn on.

25. A voltage detection and sequencing system for applying a plurality of voltages to an electrical system in a predetermined sequence, comprising:

a plurality of means for detecting one of said plurality of supply voltages in a predetermined sequence as controlled by a sequencing means;

wherein each means for detecting one of said plurality of supply voltages comprises a means for producing a control signal when said one supply voltage supplied is above a predetermined threshold and each means for detecting one of said plurality of supply voltages comprises at least one pass device under control of at least one of said control signals;

a means for receiving as input signals said control signals and to output an enable signal to turn on said at least one pass device; and a means for providing said plurality of supply voltages to power all of said means for detecting one of said plurality of supply voltages.

* * * * *